(12) United States Patent
Iwase et al.

(10) Patent No.: US 8,247,860 B2
(45) Date of Patent: Aug. 21, 2012

(54) NONVOLATILE SEMICONDUCTOR MEMORY DEVICE AND METHOD FOR MANUFACTURING SAME

(75) Inventors: Masao Iwase, Kanagawa-ken (JP); Tadashi Iguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 399 days.

(21) Appl. No.: 12/646,684

(22) Filed: Dec. 23, 2009

(65) Prior Publication Data

US 2011/0001178 A1 Jan. 6, 2011

(30) Foreign Application Priority Data

Jul. 1, 2009 (JP) ................................. 2009-156731

(51) Int. Cl.
*H01L 29/788* (2006.01)

(52) U.S. Cl. ........ 257/315; 257/314; 257/316; 257/324; 257/E21.677; 257/E23.145; 257/E29.3; 257/E21.645; 257/E21.646; 257/E21.657; 257/E21.659; 257/E21.084; 257/E21.652; 257/E27.096; 257/E29.309; 257/E27.103; 257/E21.423; 257/E21.679; 257/E21.68; 257/E27.081; 438/129; 438/257; 438/618; 438/637; 438/694; 438/670; 365/185.17; 365/185.18; 365/185.11; 365/185.14; 365/185.27; 365/185.28

(58) Field of Classification Search ................ 257/314, 257/315, 316, 324, 329, E21.645, E21.68, 257/E27.081, E27.103, E23.145, E21.677, 257/E21.646, E21.654, E21.657, E21.659, 257/E27.084, E21.652, E29.309, E27.026, 257/E21.423, E21.679, E29.3; 438/129, 438/257, 618, 637, 694, 740; 365/185.18, 365/185.27, 185.28, 185.11, 185.14, 185.17
See application file for complete search history.

(56) References Cited

U.S. PATENT DOCUMENTS 7,539,056 B2 * 5/2009 Katsumata et al. ...... 365/185.18
2007/0252201 A1 * 11/2007 Kito et al. ..................... 257/331

FOREIGN PATENT DOCUMENTS

JP 2007-266143 10/2007

* cited by examiner

*Primary Examiner* — Matthew Reames
*Assistant Examiner* — Ermias Woldegeorgis
(74) *Attorney, Agent, or Firm* — Finnegan, Henderson, Farabow, Garrett & Dunner, L.L.P.

(57) ABSTRACT

A nonvolatile semiconductor memory device includes: a substrate; a stacked body with a plurality of dielectric films and electrode films alternately stacked therein, the stacked body being provided on the substrate and having a step in its end portion for each of the electrode films; an interlayer dielectric film burying the end portion of the stacked body; a plurality of semiconductor pillars extending in the stacking direction of the stacked body and penetrating through a center portion of the stacked body; a charge storage layer provided between one of the electrode films and one of the semiconductor pillars; and a plug buried in the interlayer dielectric film and connected to a portion of each of the electrode films constituting the step, a portion of each of the dielectric films in the center portion having a larger thickness than a portion of each of the dielectric films in the end portion.

12 Claims, 12 Drawing Sheets

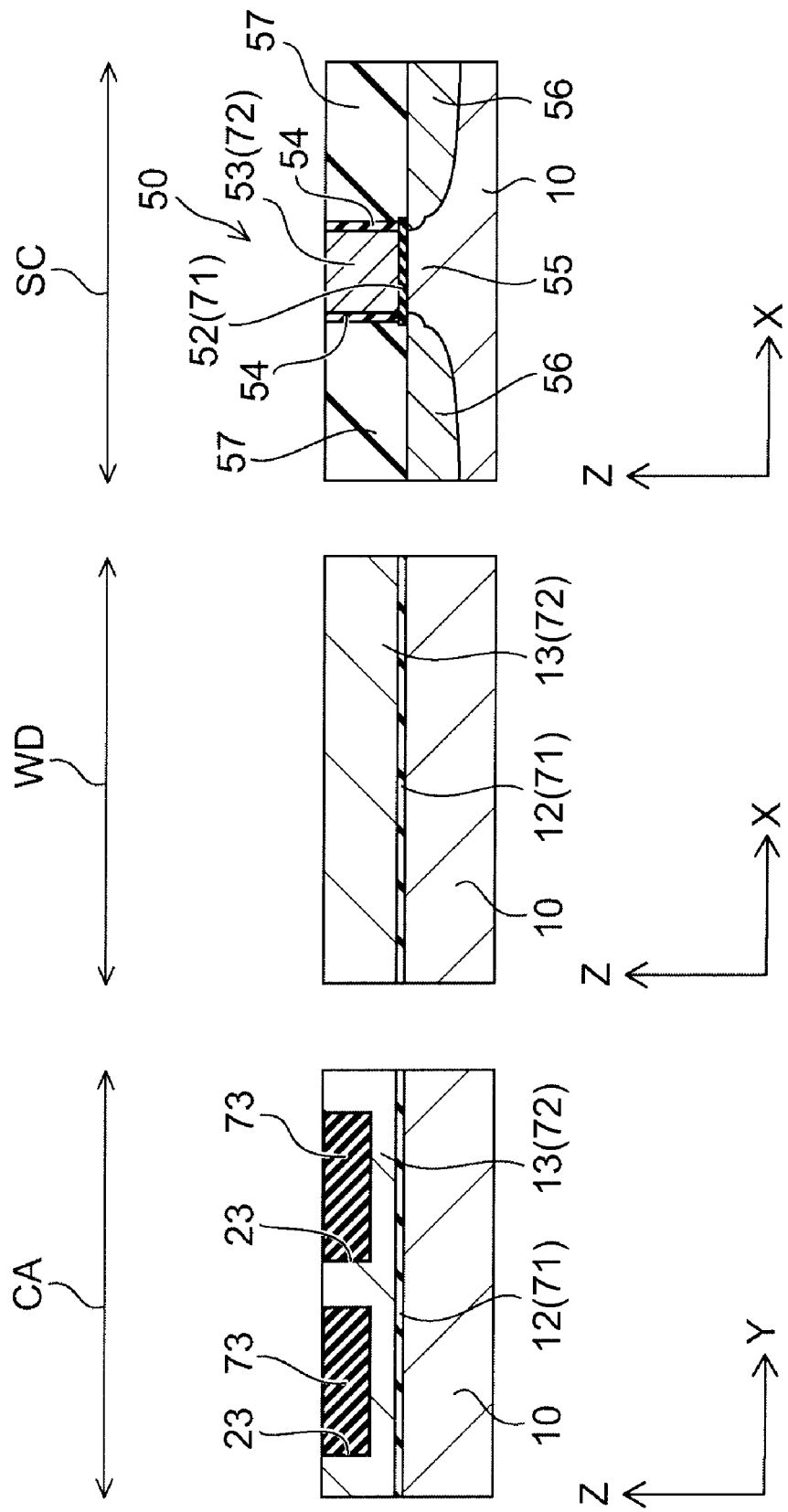

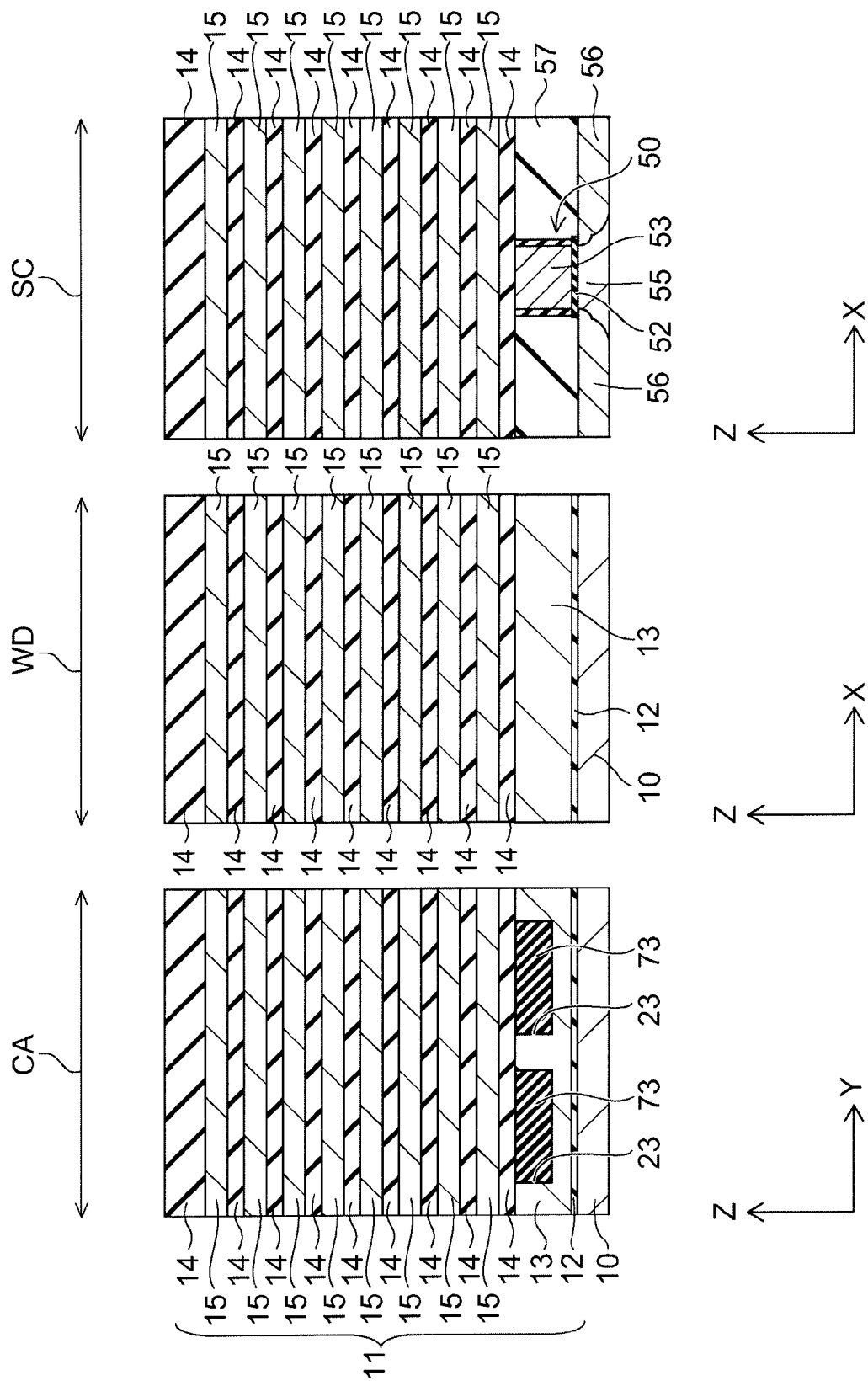

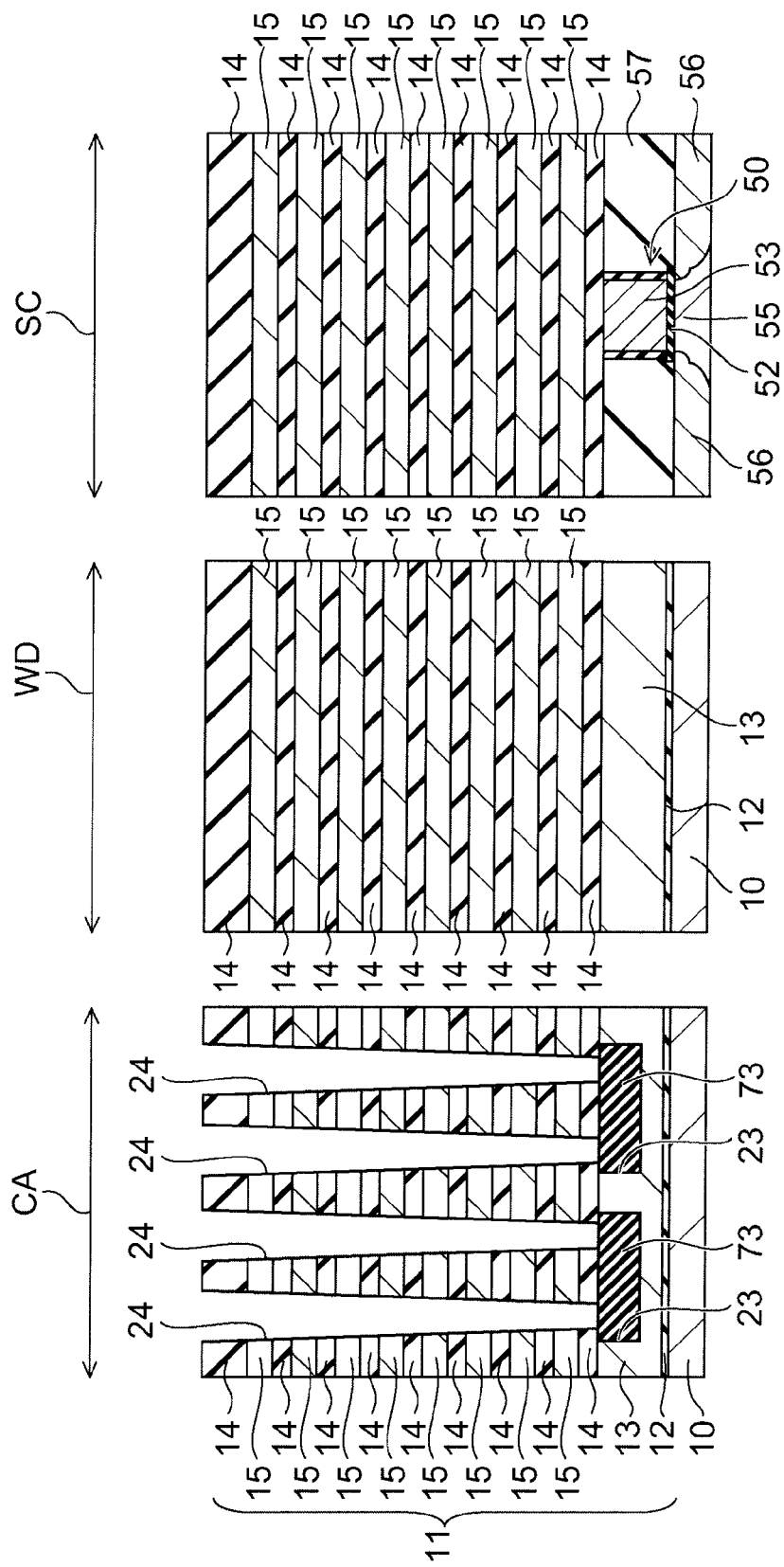

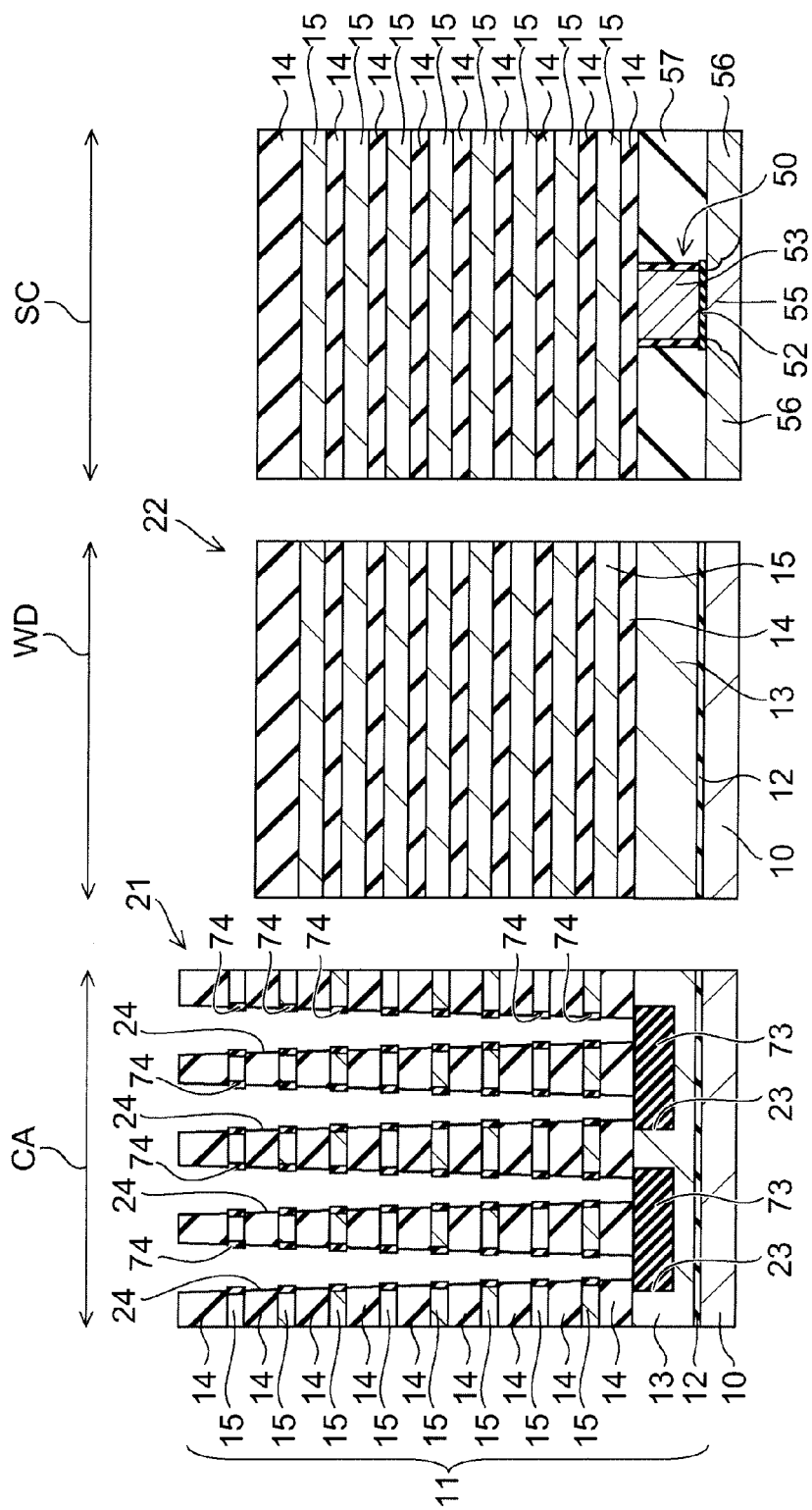

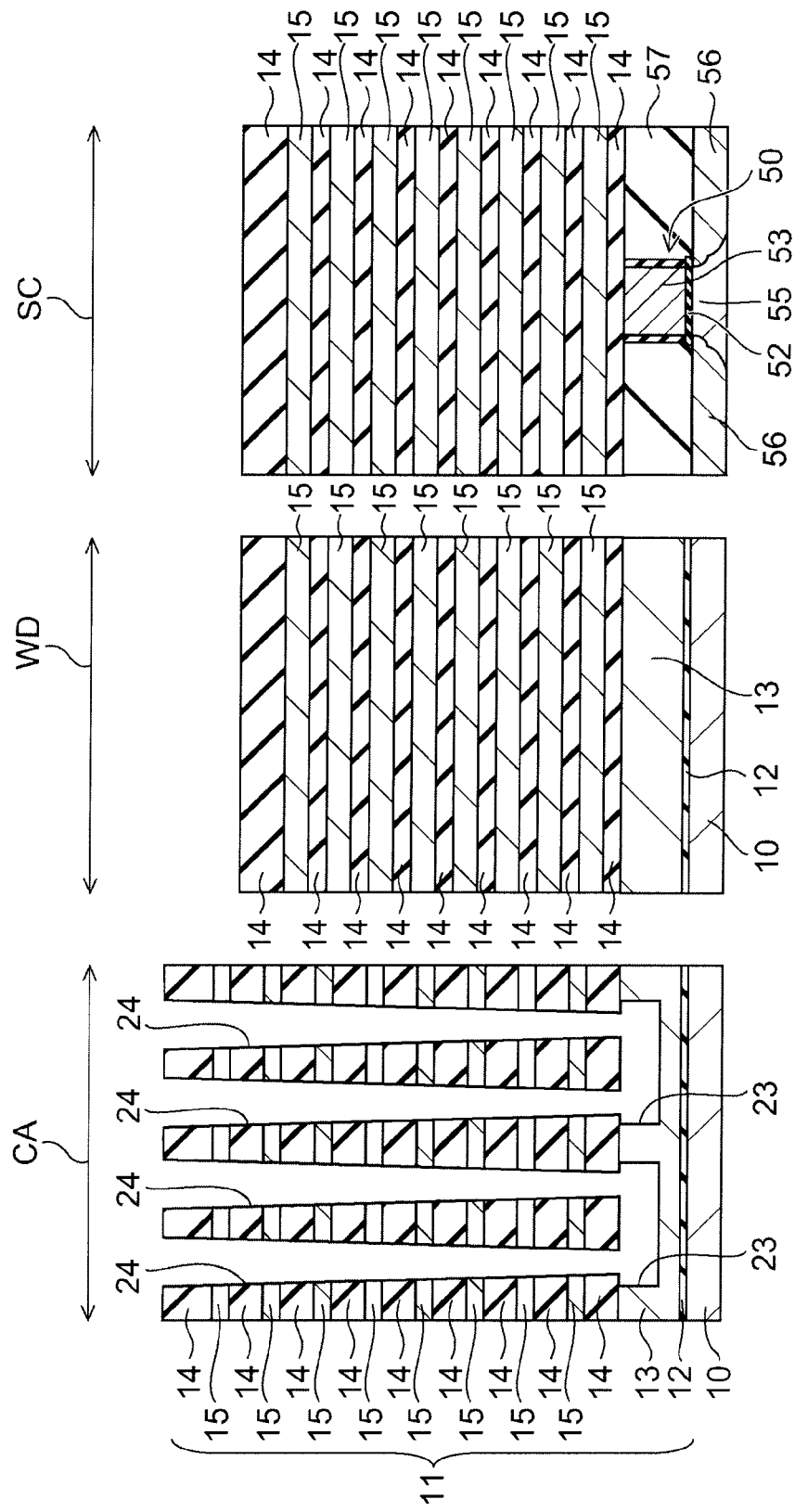

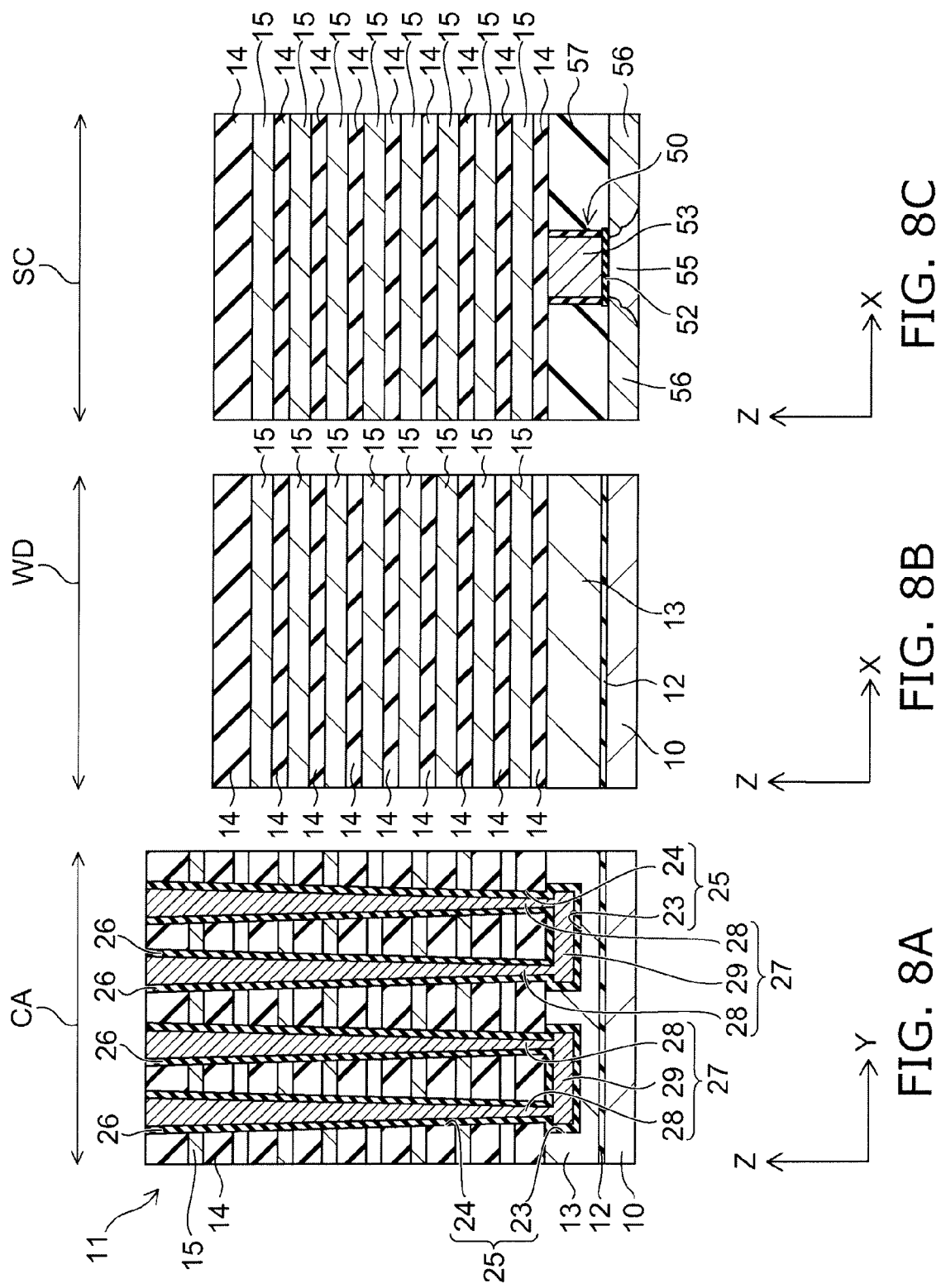

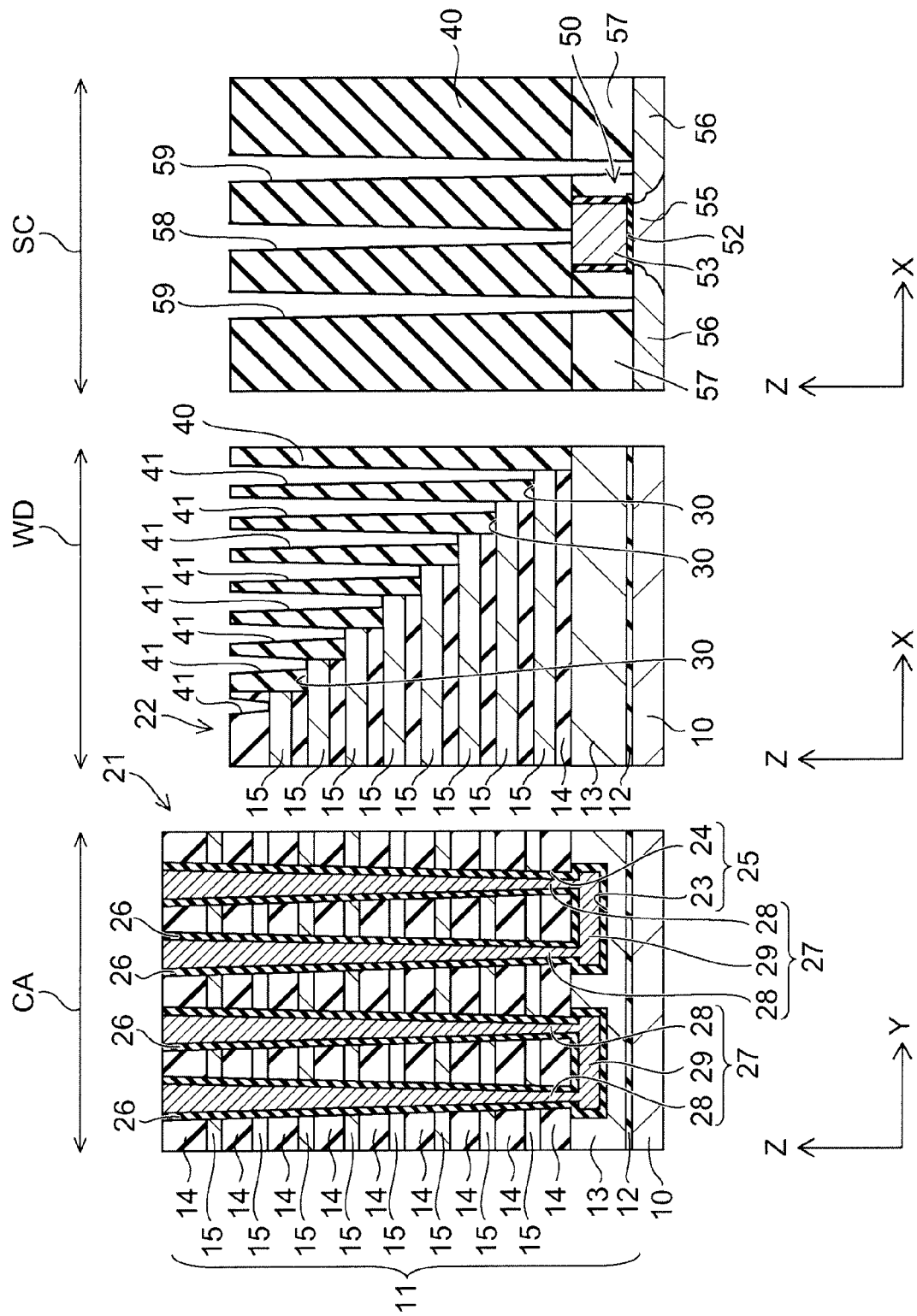

US 8,247,860 B2

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-156731, filed on Jul. 1, 2009; the entire contents of which are incorporated herein by reference.

BACKGROUND OF THE INVENTION

1. Field of the Invention

This invention relates to a nonvolatile semiconductor memory device and a method for manufacturing the same.

2. Background Art

In recent years, semiconductor memory devices with memory cells three-dimensionally arranged therein have been proposed to increase their integration density for higher capacity and lower cost per bit. For instance, in a technique disclosed in JP-A 2007-266143 (Kokai), electrode films and dielectric films are alternately stacked on a silicon substrate to form a stacked body, and then memory holes are formed in this stacked body. A charge storage layer is formed on the side surface of the memory hole, and a silicon pillar is buried inside the memory hole. Thus, a memory cell can be formed at each intersection between the electrode film and the silicon pillar, and the memory cells can be three-dimensionally arranged.

In such a three-dimensional semiconductor memory device, the high integration of memory cells is realized by stacking a plurality of electrode films. Hence, the number of stacked electrode films needs to be increased to achieve a sufficient integration density. On the other hand, to avoid increasing the manufacturing cost, memory holes need to be simultaneously formed in the stacked body with a plurality of electrode films stacked therein. Hence, increasing the number of stacked electrode films results in thickening the stacked body, and the aspect ratio of the memory hole, that is, the ratio of the depth of the memory hole to its diameter becomes large.

However, the memory hole, particularly when formed in a dielectric film, tends to have a tapered side surface, and is thinned downward. Thus, for a large aspect ratio of the memory hole, the diameter of the memory hole differs between its upper portion and lower portion, and the curvature of the inner surface of the memory hole differs therebetween. This makes a difference in the intensity of electric field applied to the charge storage layer and in the characteristics of the memory cell.

SUMMARY OF THE INVENTION

According to an aspect of the invention, there is provided a nonvolatile semiconductor memory device including: a substrate; a stacked body with a plurality of dielectric films and electrode films alternately stacked therein, the stacked body being provided on the substrate and having a step in its end portion for each of the electrode films; an interlayer dielectric film burying the end portion of the stacked body; a plurality of semiconductor pillars extending in the stacking direction of the stacked body and penetrating through a center portion of the stacked body; a charge storage layer provided between one of the electrode films and one of the semiconductor pillars; and a plug buried in the interlayer dielectric film and connected to a portion of each of the electrode films constituting the step, a portion of each of the dielectric films in the center portion having a larger thickness than a portion of each of the dielectric films in the end portion.

According to another aspect of the invention, there is provided a method for manufacturing a nonvolatile semiconductor memory device, including: forming a stacked body by alternately stacking a plurality of dielectric films and electrode films on a substrate; forming a plurality of memory holes extending in a stacking direction of the stacked body in a center portion of the stacked body; oxidizing, through the memory holes, at least a portion located between the memory holes in a portion of each of the electrode films in contact with the dielectric films; forming a charge storage layer on an inner surface of each of the memory holes; forming a plurality of semiconductor pillars by burying a semiconductor material in the memory holes; forming a step for each of the electrode films in an end portion of the stacked body; forming an interlayer dielectric film so as to bury the end portion of the stacked body; forming a plug hole in the interlayer dielectric film so as to reach a portion of each of the electrode films constituting the step; and forming a plug by burying a conductive material in the plug hole.

BRIEF DESCRIPTION OF THE DRAWINGS

FIGS. 3A to 3C are process cross-sectional views illustrating a method for manufacturing the nonvolatile semiconductor device according to the embodiment;

FIGS. 4A to 4C are process cross-sectional views illustrating a method for manufacturing the nonvolatile semiconductor device according to the embodiment;

FIGS. 5A to 5C are process cross-sectional views illustrating a method for manufacturing the nonvolatile semiconductor device according to the embodiment;

FIGS. 6A to 6C are process cross-sectional views illustrating a method for manufacturing the nonvolatile semiconductor device according to the embodiment;

FIGS. 7A to 7C are process cross-sectional views illustrating a method for manufacturing the nonvolatile semiconductor device according to the embodiment;

FIGS. 8A to 8C are process cross-sectional views illustrating a method for manufacturing the nonvolatile semiconductor device according to the embodiment;

FIGS. 11A to 11C are process cross-sectional views illustrating a method for manufacturing the nonvolatile semiconductor device according to the embodiment; FIG. 12A shows the state before oxidation treatment, and FIG. 12B shows the state after oxidation treatment.

DETAILED DESCRIPTION OF THE INVENTION

An embodiment of the invention will now be described with reference to the drawings.

Figure 1:
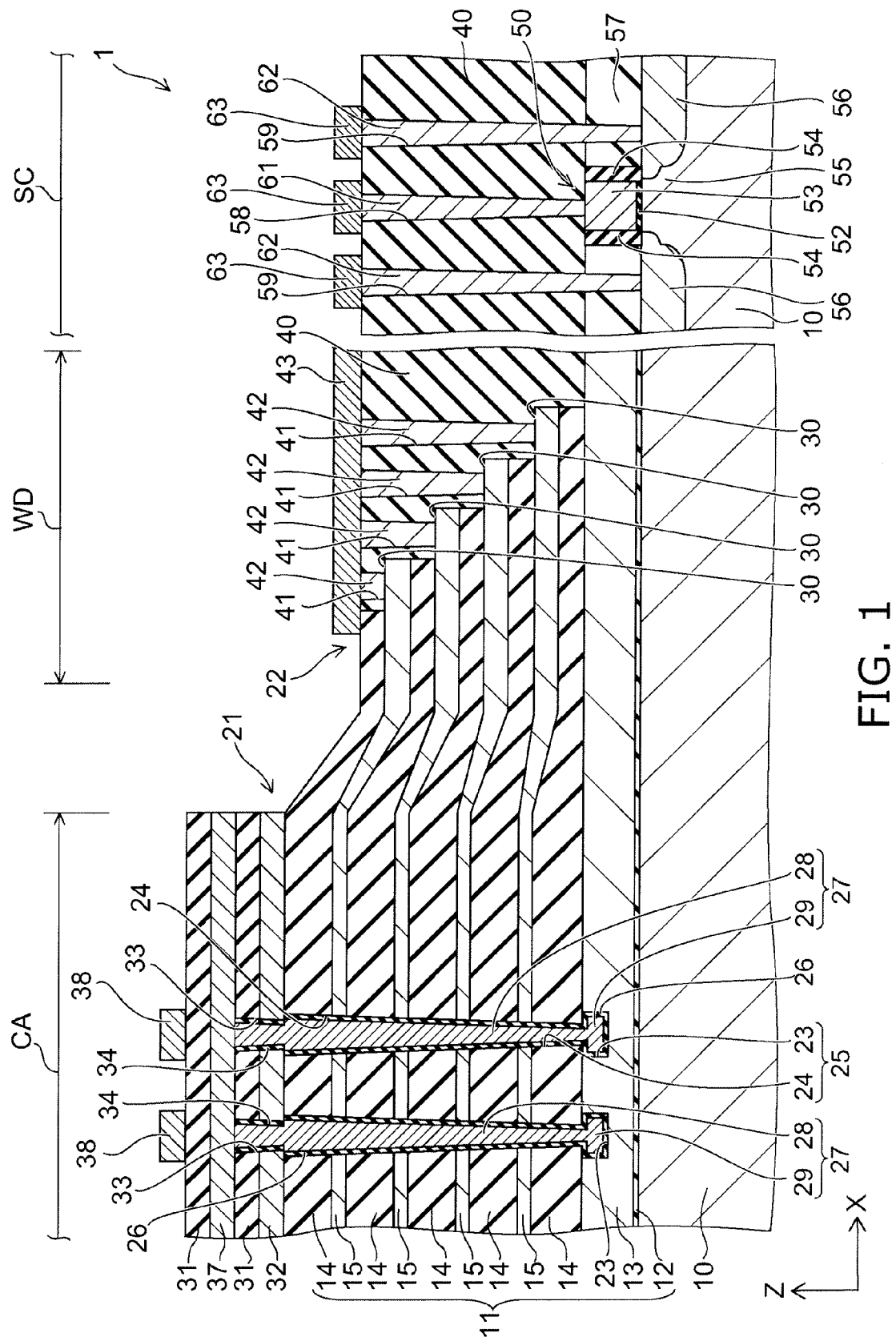
FIG. 1 is a cross-sectional view illustrating a nonvolatile semiconductor memory device according to an embodiment of the invention.

FIG. 1 is a cross-sectional view illustrating a nonvolatile semiconductor memory device according to this embodiment.

Figure 2:
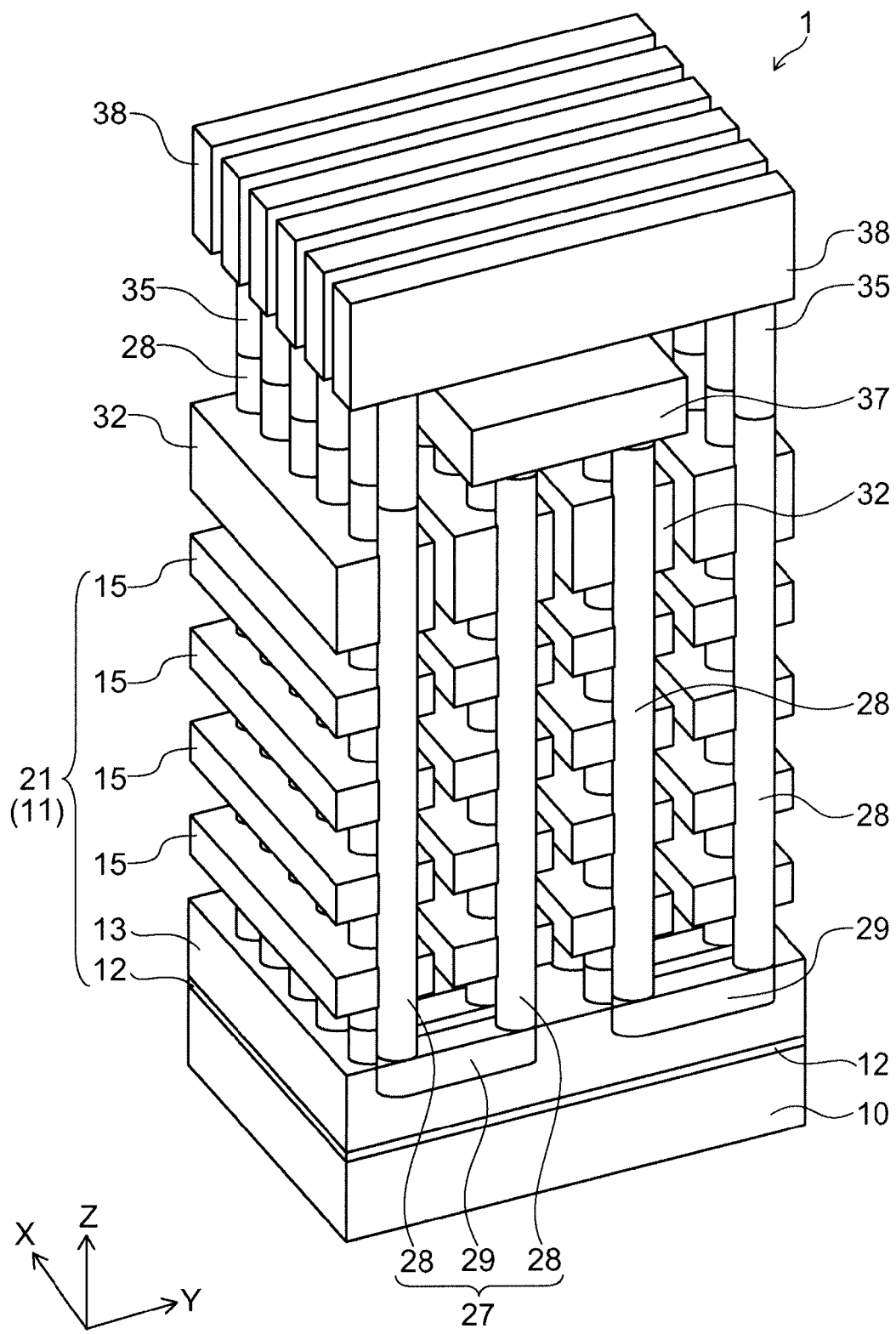
FIG. 2 is a perspective view illustrating a cell array region of the nonvolatile semiconductor memory device according to the embodiment.

FIG. 2 is a perspective view illustrating the cell array region of the nonvolatile semiconductor memory device according to this embodiment.

In FIG. 2, for convenience of illustration, the conductive portions are primarily shown, and most of the dielectric portions are omitted.

The nonvolatile semiconductor memory device according to this embodiment is characterized as follows. It includes a stacked body with a plurality of electrode films and dielectric films alternately stacked therein to form a plurality of memory cells. The stacked body includes a center portion located in a cell array region and including three-dimensionally arranged memory cells, and an end portion located in an interconnection drawing region and configured to draw out the electrode films through plugs. The dielectric film is thicker in the center portion than in the end portion, and the electrode film is thicker in the end portion than in the center portion. Furthermore, the total thickness of the stacked body is thicker in the center portion than in the end portion. Thus, with charge retention between the memory cells ensured in the center portion, the interconnect resistance can be reduced in the end portion.

The method for manufacturing a nonvolatile semiconductor memory device according to this embodiment is characterized as follows. When the stacked body is formed, the electrode film is formed thicker than its final dimension, and the dielectric film is formed thinner than its final dimension, so that the total thickness of the stacked body is thinner than its final dimension. Next, memory holes are formed in the center portion of the stacked body. Here, because the stacked body is thin, the memory holes are easy to form. Next, by oxidation treatment, the electrode film is partly oxidized through the memory hole and formed into a dielectric film. Thus, in the center portion, the electrode film is thinned, the dielectric film is thickened, and the overall stacked body is also thickened to its final dimension by expansion associated with oxidation. In the end portion, because the electrode film is not oxidized, the electrode film remains thick. Subsequently, an interlayer dielectric film is formed so as to cover the end portion of the stacked body, and plug holes are formed in this interlayer dielectric film so as to terminate at the electrode films. Here, because the electrode film in the end portion is thick, a large processing margin can be provided at the termination point and facilitates processing the plug hole. Furthermore, the portion of the electrode film exposed to the inner surface of the memory hole is also oxidized, and then a sacrificial member for forming a U-pillar is buried therein. This facilitates removing the sacrificial member.

In the following, the configuration of the semiconductor memory device according to this embodiment is described in detail.

As shown in FIGS. 1 and 2, the nonvolatile semiconductor memory device 1 (hereinafter also simply referred to as "device 1") according to this embodiment includes a silicon substrate 10. The silicon substrate 10 includes a cell array region CA, an interconnection drawing region WD, and a surrounding circuit region SC. The interconnection drawing region WD is located adjacent to the cell array region CA. The surrounding circuit region SC is located around the region including the cell array region CA and the interconnection drawing region WD.

In the following, for convenience of description, an XYZ orthogonal coordinate system is herein introduced. In this coordinate system, of the two directions parallel to the upper surface of the silicon substrate 10 and orthogonal to each other, the direction from the cell array region CA to the interconnection drawing region WD is referred to as the X direction, and the direction orthogonal to this X direction is referred to as the Y direction. Furthermore, the direction orthogonal to the upper surface of the silicon substrate 10, or the stacking direction of the layers, is referred to as the Z direction.

In the cell array region CA and the interconnection drawing region WD, a stacked body 11 is formed on the silicon substrate 10. More specifically, a dielectric film 12 illustratively made of silicon oxide is formed on the upper surface of the silicon substrate 10, and a back gate electrode 13 illustratively made of polysilicon is provided thereon. A plurality of dielectric films 14 and electrode films 15 are alternately stacked on the back gate electrode 13. The dielectric film 14 is formed from an oxide of a conductive material forming the electrode film 15. For instance, the electrode film 15 is formed from polysilicon, and the dielectric film 14 is formed from silicon oxide. The dielectric film 12, the back gate electrode 13, the plurality of dielectric films 14, and the plurality of electrode films 15 constitute the stacked body 11. In the stacked body 11, the portion located in the cell array region CA constitutes a center portion 21, and the portion located in the interconnection drawing region WD constitutes an end portion 22. While the number of electrode films 15 stacked in the stacked body 11 is four in the example shown in FIGS. 1 and 2, the number of stacked electrode films 15 is not limited to four.

In the stacked body 11, the thicknesses of the dielectric film 14 and the electrode film 15 in the center portion 21 are different from those in the end portion 22. More specifically, the portion of the dielectric film 14 located in the center portion 21 has a larger thickness than the portion of the dielectric film 14 located in the end portion 22. On the other hand, the portion of the electrode film 15 located in the end portion 22 has a larger thickness than the portion of the electrode film 15 located in the center portion 21. Furthermore, the total thickness of the stacked body 11 in the center portion 21 is larger than the total thickness of the stacked body 11 in the end portion 22. It is noted that the device 1 includes a buffer region between the center portion 21 and the end portion 22, that is, between the cell array region CA and the interconnection drawing region WD, to absorb the step difference and prevent disconnection of the electrode film 15.

First, the configuration of the center portion 21 is described. In the center portion 21 of the stacked body 11 located in the cell array region CA, a plurality of recesses 23 are formed in the upper surface of the back gate electrode 13. The recess 23 is shaped like a rectangular parallelepiped with the longitudinal side illustratively directed in the Y direction. Furthermore, in the center portion 21, a plurality of memory holes 24 extending in the stacking direction (Z direction) of the layers are formed through the stacked body 11. Each memory hole 24 penetrates through the electrode film 15 at each stage, and its lower end reaches the back gate electrode 13.

The memory holes 24 are arranged in a matrix along the X and Y directions. A pair of memory holes 24 adjacent in the Y direction communicates with both end portions of one recess 23. Thus, the pair of memory holes 24 adjacent in the Y direction and the recess 23 allowing them to communicate with each other constitutes one continuous U-hole 25. Thus, a plurality of U-holes 25 are formed in the center portion 21 of the stacked body 11.

A memory film 26 is continuously and seamlessly provided on the inner surface of the U-hole 25. In the memory film 26, a block layer made of silicon oxide, a charge storage layer made of silicon nitride, and a tunnel layer made of silicon oxide are stacked sequentially from outside and constitute an ONO (oxide-nitride-oxide) film. The block layer is a layer, which passes no substantial current even if a voltage within the driving voltage range of the device 1 is applied. The charge storage layer is a layer capable of retaining charge, such as a layer containing electron trap sites. The tunnel layer is a layer, which is normally insulative, but passes a tunnel current when a prescribed voltage within the driving voltage range of the device 1 is applied.

Furthermore, a semiconductor material doped with impurities, such as polysilicon, is buried inside the U-hole 25. Thus, a U-pillar 27 is provided inside the U-hole 25. In the U-pillar 27, the portion located in the memory hole 24 is a silicon pillar 28, and the portion located in the recess 23 is a connecting member 29. The silicon pillar 28 is shaped like a column extending in the Z direction, such as a cylinder having a generally uniform diameter. The connecting member 29 is shaped like a rectangular parallelepiped extending in the Y direction. The two silicon pillars 28 and one connecting member 29 constituting the U-pillar 27 are integrally formed, and hence the U-pillar 27 is seamlessly and continuously formed along its longitudinal direction. Furthermore, the U-pillar 27 is insulated from the back gate electrode 13 and the electrode films 15 by the memory film 26.

The electrode film 15 is divided in the Y direction into a plurality of word lines extending in the X direction. A plurality of silicon pillars 28 arranged in the X direction penetrate through a common word line. Furthermore, the thickness of the dielectric film 14 between the silicon pillars 28 becomes thicker towards the silicon pillars 28.

Next, the configuration of the end portion 22 is described. In the end portion 22 of the stacked body 11 located in the interconnection drawing region WD, a step 30 is formed for each electrode film 15, and the steps 30 are processed into a staircase pattern. More specifically, as viewed from above (Z direction), the electrode film 15 at each stage is located inside the underlying electrode film 15, and no overlying electrode film 15 is located immediately above the end portion of the electrode film 15 at each stage. Furthermore, no electrode film 15 is located immediately above the end portion of the back gate electrode 13. In the end portion 22, a plurality of word lines divided along the Y direction are combined into an electrode film 15 at each stage.

Next, the configuration located above and lateral to the stacked body 11 is described. An interlayer dielectric film 31 is provided above the stacked body 11, that is, above the center portion 21, in the cell array region CA, and a plurality of line-shaped select gate electrodes 32 extending in the X direction are provided in the interlayer dielectric film 31. Each select gate electrode 32 is located immediately above a word line, that is, a divided portion of the electrode film 15.

A select hole 33 is formed in the portion of the interlayer dielectric film 31 located immediately above the memory hole 24, and communicates with the memory hole 24. A select gate dielectric film 34 is formed on the side surface of the select hole 33. The lower portion of the select hole 33 is filled with polysilicon so that the U-pillar 28 is extended therein, and a plug 35 is buried in the upper portion of the select hole 33.

Source lines 37 extending in the X direction are buried in the interlayer dielectric film 31. One source line 37 is provided for every two U-pillars 27 arranged along the Y direction, and connected to the upper end portion of one of a pair of silicon pillars 28 constituting each U-pillar 27. Furthermore, bit lines 38 extending in the Y direction are buried above the source line 37 in the interlayer dielectric film 31. In a pair of silicon pillars 28 constituting each U-pillar 27, the bit line 38 is connected to the upper end portion of the other silicon pillar 28, which is not connected to the source line 37. Hence, the U-pillar 27 is connected between the source line 37 and the bit line 38.

Throughout the interconnection drawing region WD and the surrounding circuit region SC, an interlayer dielectric film 40 is provided lateral to the stacked body 11. The interlayer dielectric film 40 covers the side surface of the end portion 22 of the stacked body 11. In the interconnection drawing region WD, a plurality of plug holes 41 extending in the Z direction are formed through the interlayer dielectric film 40. Each plug hole is formed immediately above the end portion of each electrode film 15 and reaches the end portion of each electrode film 15. The plug holes 41 are formed at positions mutually different in the X and Y directions. In FIG. 1, for convenience of illustration, a plurality of plug holes 41 are drawn as if they were arranged in a line along the X direction, but in reality, as described above, the formation positions of the plug holes 41 are displaced from each other not only in the X direction but also in the Y direction.

Each plug hole 41 is shaped like a cylinder close to an inverted truncated cone with the upper portion being relatively thick and the lower portion being relatively thin. A conductive material is buried in the plug hole 41 to form a plug 42. The lower end of each plug 42 is connected to an electrode film 15. A plurality of word interconnections 43 extending in the X direction are provided on the interlayer dielectric film 40. Each word interconnection 43 is connected to the upper end of each plug 42. Thus, each electrode film 15 is drawn out by each word interconnection 43 through each plug 42.

The surrounding circuit region SC includes a control circuit for controlling the cell array region CA. In the following description, one field-effect transistor 50 is taken as an example of the elements constituting the control circuit. A gate dielectric film 52 illustratively made of silicon oxide is provided on the silicon substrate 10, and a gate electrode 53 illustratively made of polysilicon is provided thereon. A sidewall 54 illustratively made of silicon oxide is provided on the side surface of the gate electrode 53. The upper portion of the silicon substrate 10 immediately below the gate electrode 53 constitutes a channel region 55, and a pair of source/drain regions 56 is formed in the regions sandwiching the channel region 55.

Furthermore, the surrounding circuit region SC includes an interlayer dielectric film 57 so as to bury the gate electrode and the sidewall 54. The thickness of the interlayer dielectric film 57 is equal to that of the gate electrode 53. The aforementioned interlayer dielectric film 40 is provided on the interlayer dielectric film 57. Furthermore, plug holes 58 and 59 extending in the Z direction are formed in the interlayer dielectric film 57 and the interlayer dielectric film 40. The plug hole 58 is formed immediately above the gate electrode 53 and reaches the upper surface of the gate electrode 53. There are at least two plug holes 59, each formed immediately above the source/drain region 56 and reaching the source/drain region 56.

Like the plug hole 41, each of the plug holes 58 and 59 is also shaped like a cylinder close to an inverted truncated cone with the upper portion being relatively thick and the lower portion being relatively thin. A conductive material is buried in the plug holes 58 and 59 to form plugs 61 and 62, respectively. The lower end of the plug 61 is connected to the gate electrode 53, and the lower end of each plug 62 is connected to each source/drain region 56. A plurality of interconnections 63 are provided on the interlayer dielectric film 40. Each interconnection 63 is connected to the upper ends of the plugs 61 and 62. In the surrounding circuit region SC, the arranging direction of the source/drain regions 56 and the extending direction of the interconnection 63 are arbitrary.

As shown in FIGS. 1 and 2, in the nonvolatile semiconductor memory device 1, the silicon pillar 28 functions as a channel, and the electrode film 15 functions as a gate electrode. Thus, a vertical memory transistor is formed at the intersection between the silicon pillar 28 and the electrode film 15. Each memory transistor functions as a memory cell by storing electrons in the charge storage layer of the memory film 26 located between the silicon pillar 28 and the electrode film 15. The stacked body 11 includes a plurality of silicon pillars 28 arranged in a matrix along the X and Y directions. Hence, a plurality of memory transistors are three-dimensionally arranged along the X, Y, and Z directions.

Furthermore, a field-effect transistor is formed also between the select gate electrodes 32 and the silicon pillar 28. More specifically, a vertical field-effect transistor is formed with the silicon pillar 28 serving as a channel, the select gate electrode 32 serving as a gate electrode, and the select gate dielectric film 34 serving as a gate dielectric film. Thus, by selecting the potential of the select gate electrode 32, it is possible to switch whether the U-pillar 27 is connected to the bit line 38 or the source line 37.

Moreover, the back gate electrode 13 and the connecting member 29 also constitute a field-effect transistor with the connecting member 29 serving as a channel, the back gate electrode 13 serving as a gate electrode, and the memory film 26 therebetween serving as a gate dielectric film. Thus, by selecting the potential of the back gate electrode 13, it is possible to switch whether the connecting member 29 is brought into the conducting or non-conducting state. Consequently, the conduction state of the overall U-pillar 27 can be controlled.

In the device 1, the control circuit in the surrounding circuit region SC individually controls the potential of each silicon pillar 28 by applying a prescribed potential to the bit line 38 and the source line 37 and selecting the potential of the select gate electrode 32 and the back gate electrode 13. On the other hand, the control circuit applies a prescribed potential of the electrode film 15 through the word interconnection 43 and the plug 42. Thus, in a memory cell, by raising the potential to the electrode film 15 relative to the potential of the silicon pillar 28, electrons are injected from the silicon pillar 28 into the charge storage layer of the memory film 26 to write data. The threshold of the memory transistor is changed by storage of electrons in its memory film 26. Thus, by passing a current to the U-pillar 27, which this memory transistor belongs, it is possible to detect whether electrons are stored in the memory film 26, thereby reading data. Furthermore, by raising the potential of the silicon pillar 28 relative to the potential of the electrode film 15, holes are injected from the silicon pillar 28 into the charge storage layer of the memory film 26 so that electrons stored in the charge storage layer are pair-annihilated to erase data.

Next, a method for manufacturing a nonvolatile semiconductor memory device according to this embodiment is described in detail.

FIGS. 3A to 11C are process cross-sectional views illustrating the method for manufacturing a nonvolatile semiconductor memory device according to this embodiment, where each figure with the suffix A shows the cell array region, each figure with the suffix B shows the interconnection drawing region, and each figure with the suffix C shows the surrounding circuit region.

Figure 12A:
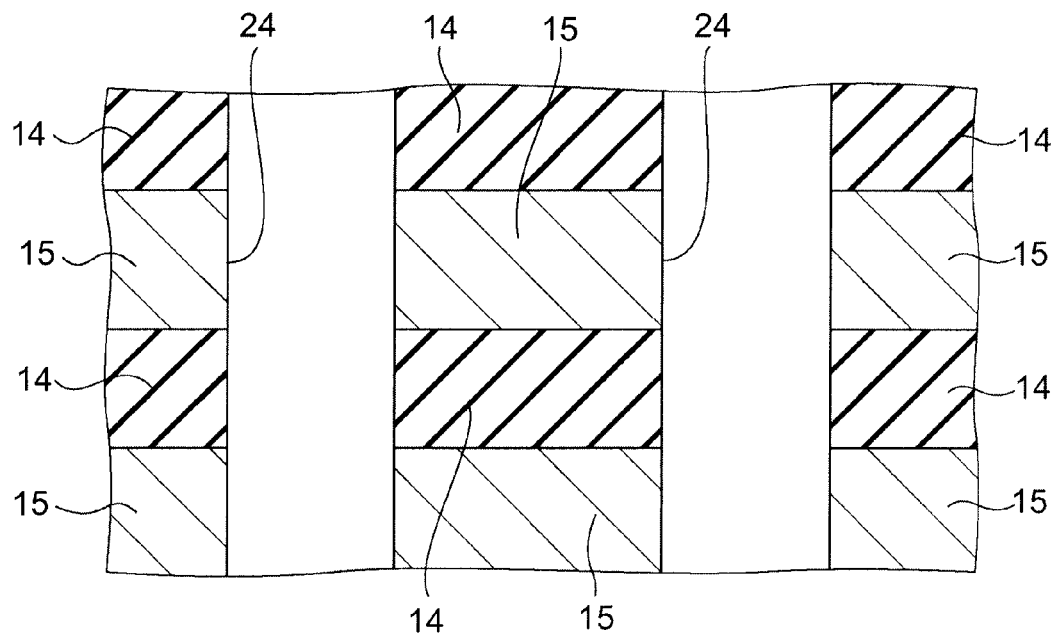
FIGS. 12A and 12B are partially enlarged cross-sectional views illustrating a method for manufacturing the nonvolatile semiconductor device according to the embodiment, where
Figure 12B:
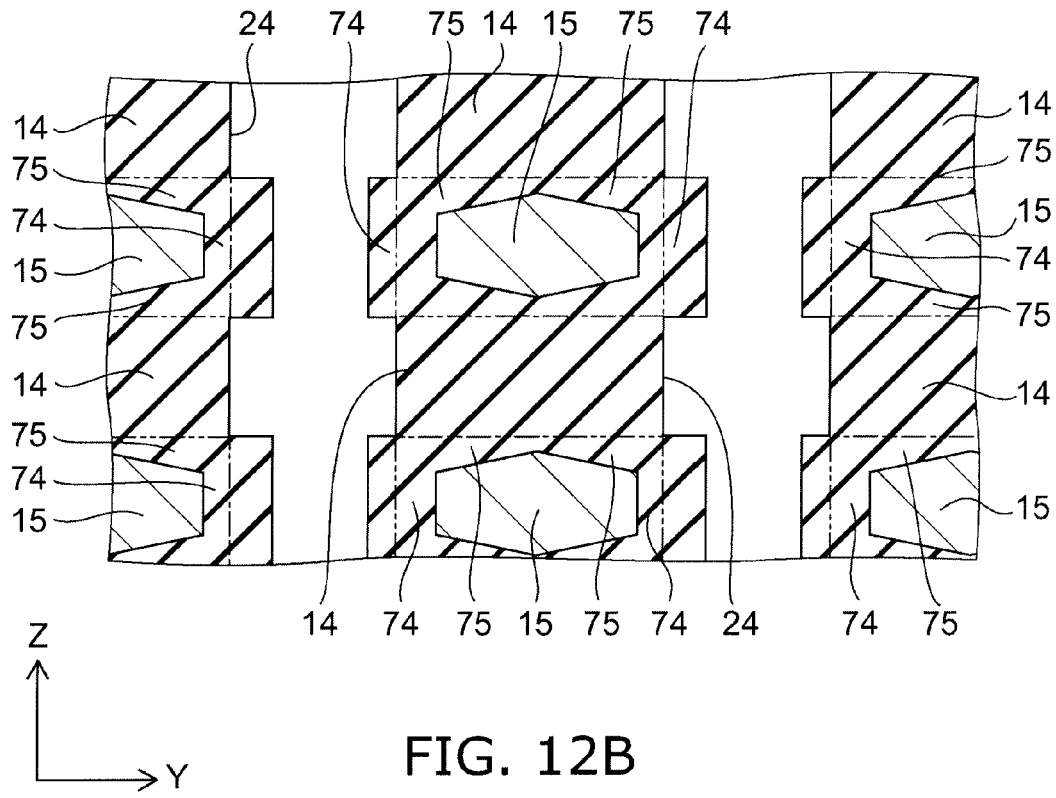

FIGS. 12A and 12B are partially enlarged cross-sectional views illustrating the method for manufacturing a nonvolatile semiconductor memory device according to this embodiment, where FIG. 12A shows the state before oxidation treatment, and FIG. 12B shows the state after oxidation treatment.

First, as shown in FIGS. 3A to 3C, a silicon substrate 10 illustratively made of single crystal silicon is prepared. A cell array region CA, an interconnection drawing region WD, and a surrounding circuit region SC are defined in the silicon substrate 10. A silicon oxide film 71 is formed entirely on the upper surface of the silicon substrate 10, and then a polysilicon film 72 is deposited entirely thereon.

Next, by the lithography and RIE (reactive ion etching) process, a plurality of recesses 23 are formed in the upper surface of the portion of the polysilicon film 72 located in the cell array region CA. The recess 23 is shaped like a rectangular parallelepiped with the longitudinal side directed in the Y direction and is formed in a location where two memory holes 24 adjacent in the Y direction can reach to both end portions of the recess 23 at the time when the memory holes 24 are formed (see FIGS. 5A to 5C) in the later process. Subsequently, a silicon nitride film 73 is deposited entirely thereon. This silicon nitride film 73 is deposited on the upper surface of the polysilicon film 72, and also buried in the recess 23.

Next, by the lithography and RIE process, the silicon nitride film 73, the polysilicon film 72, and the silicon oxide film 71 are patterned. Thus, the silicon oxide film 71 left in the cell array region CA and the interconnection drawing region WD constitutes a dielectric film 12, and the polysilicon film 72 left in the cell array region CA and the interconnection drawing region WD constitutes a back gate electrode 13. Furthermore, the silicon oxide film 71 left in the surrounding circuit region SC constitutes a gate dielectric film 52, and the polysilicon film 72 left in the surrounding circuit region SC constitutes a gate electrode 53.

Next, in the surrounding circuit region SC, the gate electrode 53 is used as a mask to ion-implant impurities into the silicon substrate 10. A silicon oxide film is deposited on the surrounding circuit region SC and etched back to form a sidewall 54 on the side surface of the gate electrode 53. Furthermore, the gate electrode 53 and the sidewall 54 are used as a mask to ion-implant impurities. Thus, a pair of source/drain regions 56 is formed in the regions sandwiching the region of the silicon substrate 10 immediately below the gate electrode 53. Here, the region between the source/drain regions 56 constitutes a channel region 55. Thus, a field-effect transistor 50 is formed in the surrounding circuit region SC.

Next, silicon oxide is entirely deposited, and the upper surface is planarized by CMP (chemical mechanical polishing) to form an interlayer dielectric film 57 in the surrounding circuit region SC so as to bury the gate electrode 53 and the sidewall 54. Next, by the RIE process, the silicon nitride film 73 deposited on the back gate electrode 13 is removed. Here, the processing time is adjusted to leave the silicon nitride film 73 in the recess 23. This silicon nitride film 73 left in the recess 23 constitutes a sacrificial member.

Next, as shown in FIGS. 4A to 4C, dielectric films 14 made of silicon oxide and electrode films 15 made of polysilicon are alternately deposited on the entire surface. Thus, a stacked body 11 composed of the dielectric film 12, the back gate electrode 13, the plurality of dielectric films 14, and the plurality of electrode films 15 is formed in the cell array region CA and the interconnection drawing region WD. Here, the uppermost layer of the stacked body 11 is the dielectric film 14. The upper portion of the stacked body 11, that is, the portion with the dielectric films 14 and the electrode films 15 alternately stacked therein, is formed also on the interlayer dielectric film 57. When the dielectric film 14 and the electrode film 15 are formed, the thickness of the dielectric film 14 is thinner than its design value in the final product of the nonvolatile semiconductor memory device 1 (see FIG. 1), and the thickness of the electrode film 15 is thicker than its design value in the final product. Furthermore, because the thickness of the dielectric film 14 is thinner than its design value, the total thickness of the stacked body 11 is also thinner than its design value in the final product. Here, the "design value" is a target value of the final dimension, and the "final dimension" is the dimension of each unit in the final product for shipment.

The electrode film 15 is formed illustratively by using the CVD (chemical vapor deposition) process to deposit polysilicon doped with phosphorus (P) as impurities at approximately $3 \times 10^{20}$ cm$^{-3}$. In the example shown in FIG. 4A and the subsequent figures, the number of stacked electrode films 15 is eight, and the number of stacked dielectric films 14 is nine. However, this embodiment is not limited thereto.

Next, as shown in FIGS. 5A to 5C, by anisotropic etching such as RIE, a plurality of memory holes 24 extending in the Z direction are formed in the stacked body 11. The memory holes 24 are arranged in a matrix along the X and Y directions so that two memory holes 24 adjacent in the Y direction reach both end portions of the sacrificial member 73 buried in the recess 23. Here, the side surface of each memory hole 24 is inevitably tapered, and hence the memory hole 24 is shaped like a cylinder close to an inverted truncated cone with the lower portion being thinner than the upper portion. In particular, the dielectric film 14 made of silicon oxide is more difficult to etch than the electrode film 15 made of polysilicon. Thus, on the side surface of the memory hole 24, the region to which the dielectric film 14 is exposed tends to have a large taper angle than the region to which the electrode film 15 is exposed. However, in this embodiment, etching is easily performed because the thickness of the stacked body 11 at this time is thinner than its design value, and in particular, the thickness of the dielectric film 14, which is difficult to etch, is thin. This suppresses the side surface of the memory hole 24 from being tapered, and the diameter of the memory hole 24 can be made uniform between the upper portion and the lower portion.

Next, as shown in FIGS. 6A to 6C, oxidation treatment is performed on the stacked body 11. For instance, the stacked body 11 is exposed to an oxygen atmosphere at a temperature of 900 to 1035° C., more particularly 1035° C., for e.g. 30 seconds. Thus, as shown in FIGS. 12A and 12B, the exposed portion of the electrode film 15 made of polysilicon in the inner surface of the memory hole 24 is oxidized to form a silicon oxide film 74. Furthermore, in the portion of the electrode film 15 in contact with the dielectric film 14, the portion located near the memory hole 24 is also oxidized to form a bird's beak 75. If the distance between the memory holes 24 is sufficiently short, the bird's beaks 75 grown starting from the adjacent memory holes 24 are joined into a penetrating bird's beak, which constitutes part of the dielectric film 14. Thus, in the cell array region CA, the electrode film 15 becomes thinner than before oxidation treatment, and the dielectric film 14 becomes thicker than before oxidation treatment. Furthermore, because polysilicon expands in volume when oxidized, the portion of the stacked body 11 located in the cell array region CA becomes thicker as a whole than before oxidation treatment. At this time, because the bird's beak 75 is grown starting from the inner surface of the memory hole 24, the thickness of the dielectric film 14 between the memory holes 24 becomes thicker towards the memory holes 24.

As an example, when oxidation treatment is performed under the condition that the silicon substrate 10 made of single crystal silicon is oxidized 5 nm, the exposed portion of the electrode films 15 made of polysilicon is oxidized approximately 8 to 10 nm. On the other hand, the contact surface of the electrode film 15 with the dielectric film 14 is oxidized approximately 3 nm because it is difficult to supply oxygen. When the polysilicon film having a thickness of 3 nm is oxidized, a silicon oxide film having a thickness of approximately 6 nm is generated. Hence, by this oxidation treatment, the thickness of the electrode film 15 decreases 3 nm each from the upper surface side and the lower surface side. On the other hand, the thickness of the dielectric film 14 increases 6 nm each at the upper surface side and the lower surface side.

In contrast, in the interconnection drawing region WD and the surrounding circuit region SC, because no memory hole 24 is formed, the electrode film 15 is not exposed to the oxygen atmosphere and is scarcely oxidized. Hence, the thickness of the electrode film 15 and the dielectric film 14 does not substantially change by oxidation treatment. Consequently, after oxidation treatment, the portion of the stacked body 11 located in the cell array region CA becomes approximately 20 to 30 nm thicker than the portion located in the interconnection drawing region WD and the surrounding circuit region SC.

Next, as shown in FIGS. 7A to 7C, for instance, phosphoric acid chemical treatment at a temperature of 150° C. is performed. Thus, the sacrificial member in the recess 23, that is, the silicon nitride film 73 (see FIGS. 6A to 6C), is removed through the memory hole 24. Here, on the inner surface of the memory hole 24, the electrode film 15 is protected by the silicon oxide film 74 (see FIGS. 6A to 6C) and hence is not etched. Subsequently, the silicon oxide film 74 is removed illustratively by using a phosphoric acid-based chemical. Thus, the electrode film 15 is exposed to the inner surface of the memory hole 24.

Next, as shown in FIGS. 8A to 8C, on the entire surface, silicon oxide is deposited to form a block layer, silicon nitride is deposited to form a charge storage layer, and then silicon oxide is deposited again to form a tunnel layer, thereby forming an ONO film. This ONO film is formed on the upper surface of the stacked body 11 and also on the inner surface of the U-hole 25. Next, an amorphous silicon film is entirely deposited. The amorphous silicon film is also buried in the U-hole 25 as well as being deposited on the upper surface of the stacked body 11. Subsequently, by CMP treatment, the amorphous silicon film and the ONO film deposited on the stacked body 11 are removed. Thus, the ONO film left on the inner surface of the U-hole 25 constitutes a memory film 26, and the amorphous silicon film left in the U-hole 25 constitutes a U-pillar 27. In the U-pillar 27, the portion left in the recess 23 constitutes a connecting member 29, and the portion left in the memory hole 24 constitutes a silicon pillar 28. Here, the amorphous silicon forming the U-pillar 27 is crystallized into polysilicon by a subsequent heat treatment.

Figures 9A, 9B, 9C:
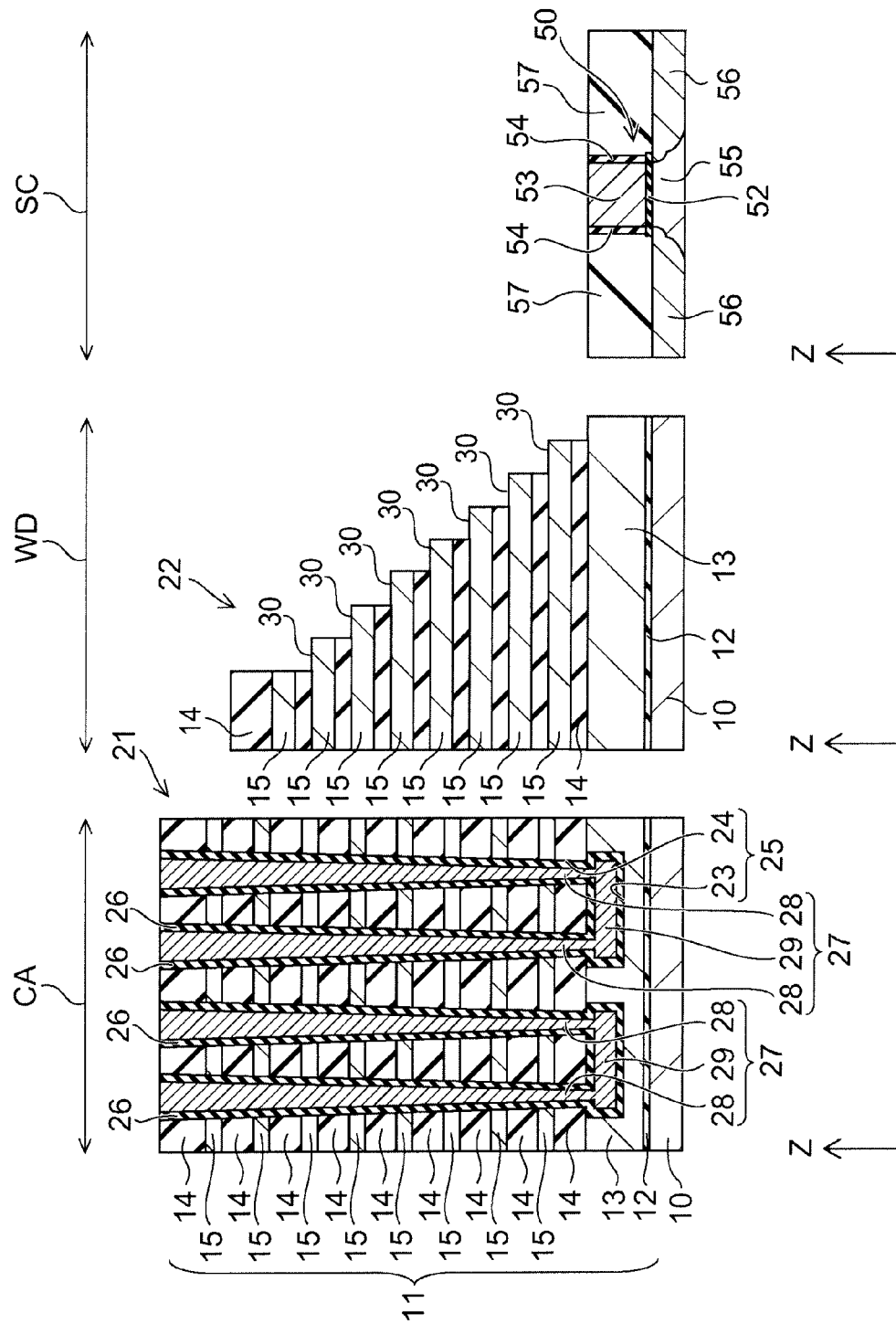
FIGS. 9A to 9C are process cross-sectional views illustrating a method for manufacturing the nonvolatile semiconductor device according to the embodiment.

Next, as shown in FIGS. 9A to 9C, in the cell array region CA and the interconnection drawing region WD, a resist pattern (not shown) is formed on the stacked body 11. Then, this resist pattern is used as a mask to perform RIE so that the stacked body 11 is removed from the surrounding circuit region SC and left only in the cell array region CA and the interconnection drawing region WD. Here, in the stacked body 11, the portion left in the cell array region CA constitutes a center portion 21, and the portion left in the interconnection drawing region WD constitutes an end portion 22. In the surrounding circuit region SC, the upper surface of the interlayer dielectric film 57 and the gate electrode 53 is exposed.

Next, by repeating the process of slimming this resist pattern and the process of using this resist pattern as a mask to perform RIE, the end portion 22 of the stacked body 11 is processed into a staircase pattern. Thus, a step 30 is formed for each electrode film 15 in the stacked body 11, and as viewed from above (Z direction), the end portion of the electrode film 15 at each stage is uncovered from the overlying electrode film 15. This enables a plug hole to reach the electrode film 15 at each stage from above in a later process.

Figures 10A, 10B, 10C:
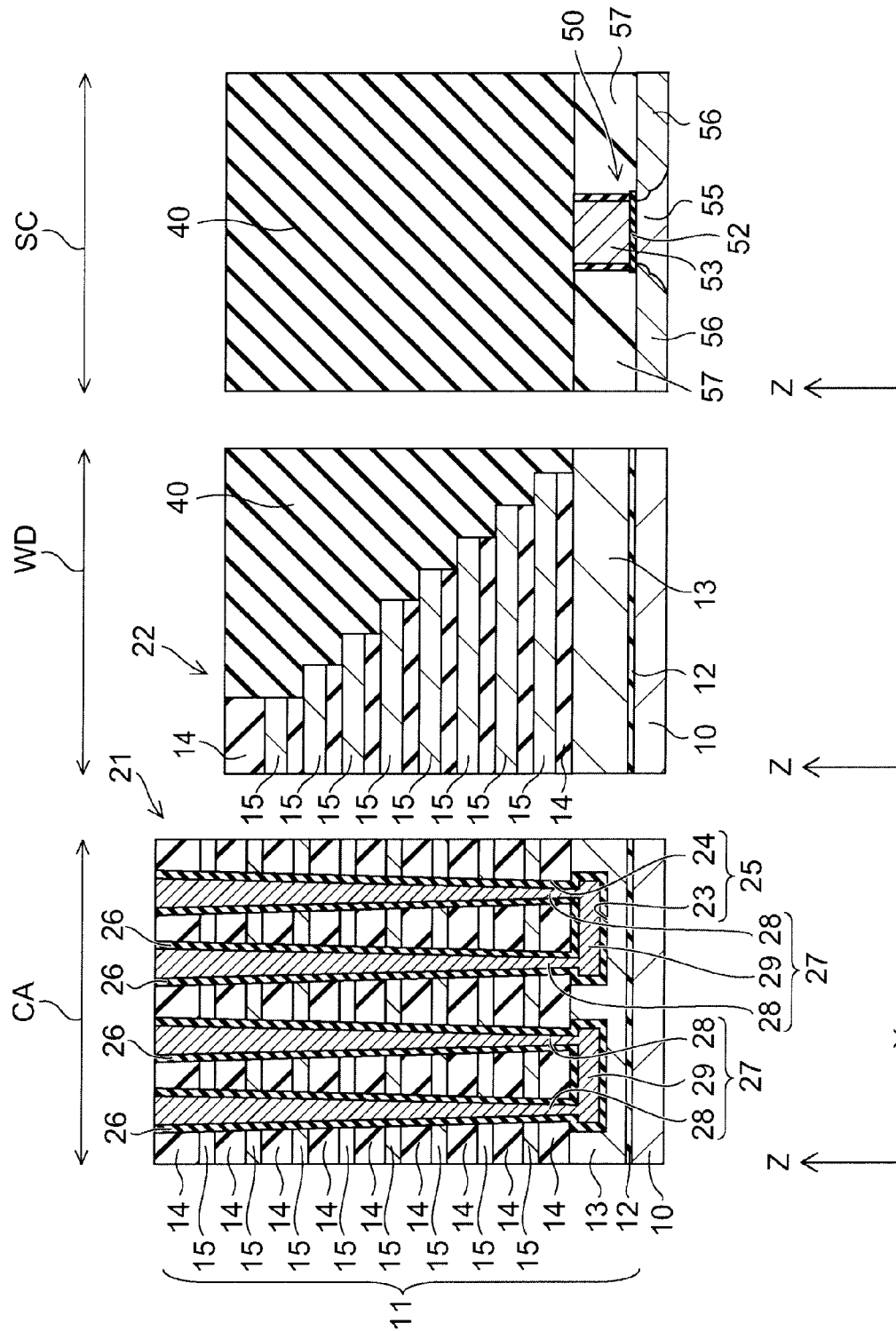
FIGS. 10A to 10C are process cross-sectional views illustrating a method for manufacturing the nonvolatile semiconductor device according to the embodiment.

Next, as shown in FIGS. 10A to 10C, silicon oxide is deposited on the interconnection drawing region WD and the surrounding circuit region SC to form an interlayer dielectric film 40 lateral to the stacked body 11. Thus, the side surface of the end portion 22 of the stacked body 11 is covered with the interlayer dielectric film 40.

Next, as shown in FIGS. 11A to 11C, in the interconnection drawing region WD and the surrounding circuit region SC, a resist pattern (not shown) is formed on the interlayer dielectric film 40 and used as a mask to perform anisotropic etching such as RIE, thereby forming plug holes 41 in the interlayer dielectric film 40 in the interconnection drawing region WD and forming plug holes 58 and 59 in the interlayer dielectric film 40 and the interlayer dielectric film 57 in the surrounding circuit region SC. Here, each of the plug holes 41 is formed at a position displaced from each other along the X and Y directions so as to reach the end portion of each of the electrode films 15, that is, the portion constituting the step 30. Furthermore, the plug hole 58 is formed so as to reach the gate electrode 53, and the plug hole 59 is formed so as to reach the source/drain region 56. Subsequently, the resist pattern is removed.

When the plug holes 41, 58, and 59 are formed, a same resist pattern is used as a mask to start etching simultaneously. Thus, normally, after etching is started, the time when the plug hole 41 reaches the uppermost electrode film 15 is the earliest, and the time when the plug hole 59 reaches the source/drain region 56 is the latest. Hence, at the bottom surface of the plug hole 41, which has reached the uppermost electrode film 15, the electrode film 15 is exposed to the etching environment until the plug hole 59 reaches the source/drain region 56. While this etching treatment is based on a selection ratio such that the etch rate of silicon oxide is sufficiently higher than the etch rate of silicon, the plug hole 41 may penetrate through the uppermost electrode film 15 if the electrode film 15 is thin and the stacked body 11 is thick. However, in this embodiment, as described above, the thickness of the electrode film 15 in the interconnection drawing region WD is large, and the thickness of the stacked body 11 in the interconnection drawing region WD is small. This can prevent the plug hole 41 from penetrating through the electrode film 15.

Next, as shown in FIGS. 1 and 2, a conductive material is buried in the plug holes 41, 58, and 59 to form plugs 42, 61, and 62, respectively. Next, a trench extending in the X direction is formed between the sequences of memory holes 24 arranged in the X direction in the center portion 21 of the stacked body 11, and a dielectric material such as silicon oxide is buried in this trench. Thus, each electrode film 15 is divided into a plurality of line-shaped portions extending in the X direction.

Next, in the cell array region CA, an interlayer dielectric film 31, select gate electrodes 32, source lines 37, and bit lines 38 are formed above the center portion 21 of the stacked body 11. In the interconnection drawing region WD, a plurality of word interconnections 43 extending in the X direction are formed on the interlayer dielectric film 40 and connected to the upper ends of the respective plugs 41. Furthermore, in the surrounding circuit region SC, a plurality of interconnections 63 are formed on the interlayer dielectric film 40 and connected to the upper ends of the respective plugs 61 and 62. Thus, the nonvolatile semiconductor memory device 1 according to this embodiment is manufactured.

Next, the operation and effect of this embodiment are described.

In this embodiment, in the process of forming a stacked body shown in FIGS. 4A to 4C, the dielectric film 14 is formed thinner than its design value in the final product, and the electrode film 15 is formed thicker than its design value in the final product. Furthermore, the overall stacked body 11 is formed thinner than its design value in the final product. Thus, in the process of forming memory holes shown in FIGS. 5A to 5C, because the thickness of the stacked body 11 is thinner than its design value, the memory hole 24 is easily formed. In particular, because the thickness of the dielectric film 14, which is difficult to etch, is thin, the memory hole 24 is formed more easily. This can suppress the side surface of the memory hole 24 from sloping, and improve the dimensional controllability of the memory hole 24. Hence, the diameter of the memory hole 24 can be made uniform in the Z direction. Consequently, the memory transistors have uniform characteristics, and hence the number of electrode films 15 in the stacked body 11 can be increased.

Subsequently, in the process shown in FIGS. 6A to 6C, oxidation treatment is performed on the stacked body 11 to oxidize the electrode film 15 through the memory hole 24 so that, in the center portion 21 of the stacked body 11, the electrode film 15 can be thinned, the dielectric film 14 can be thickened, and the total thickness of the center portion 21 can be thickened. Thus, in the nonvolatile semiconductor memory device 1 after completion, the electrode films 15 can be sufficiently spaced from each other to prevent electrons stored in the memory film 26 of one memory cell from diffusing to another memory cell adjacent in the Z direction by the self-electric field or the electric field resulting from the potential of the electrode films 15. More specifically, by providing a sufficient distance between the memory cells in the Z direction, crosstalk between the memory cells can be prevented to ensure reliability for data retention. On the other hand, in the end portion 22 of the stacked body 11, the electrode film 15 is kept thick, and hence the interconnect resistance of the electrode film 15 can be reduced.

Furthermore, by the oxidation treatment shown in FIGS. 6A to 6C, the exposed portion of the electrode film 15 in the inner surface of the memory hole 24 is oxidized to form a silicon oxide film 74. This can prevent the electrode film 15 from being etched when the sacrificial member 73 is removed in the process shown in FIGS. 7A to 7C.

Furthermore, in the end portion 22 of the stacked body 11, because the electrode film 15 is left thick, the plug hole 41 can be prevented from penetrating through the electrode film 15 when the plug holes 41, 58, and 59 are formed in the process shown in FIGS. 11A to 11C. This increases the processing margin of the plug holes and can significantly increase the stability of the electrical conduction of the plug 42. Here, if the plug hole 41 penetrates through the electrode film 15, because the underlying dielectric film 14 is easily etched, the plug hole 41 ends up reaching the electrode film 15 in the bottom. Thus, the plug 42 is connected also to the electrode film 15 in the bottom, and the device 1 fails to function normally.

Moreover, because the end portion 22 of the stacked body 11 is formed thinner than the center portion 21, the thickness of the interlayer dielectric film 40 can also be thinned. This can reduce the aspect ratio of the plug holes 41, 58, and 59, and the plug holes 41, 58, and 59 can be stably formed.

The invention has been described with reference to the embodiment. However, the invention is not limited to this embodiment. The above embodiment can be practiced in combination. Furthermore, those skilled in the art can suitably modify the above embodiment by addition, deletion, or design change of components, or by addition, omission, or condition change of processes, and such modifications are also encompassed within the scope of the invention as long as they fall within the spirit of the invention.

For instance, in the above embodiment, a U-shaped pillar is illustratively formed in the stacked body 11, but the invention is not limited thereto. For instance, a source line instead of the back gate electrode 13 can be provided in the lower portion of the stacked body 11, and an I-shaped silicon pillar can be connected between the bit line and the source line.

The invention claimed is:

1. A nonvolatile semiconductor memory device comprising:
   a substrate;
   a stacked body with a plurality of dielectric films and electrode films alternately stacked therein, the stacked body being provided on the substrate and having a step in its end portion for each of the electrode films;
   an interlayer dielectric film burying the end portion of the stacked body;
   a plurality of semiconductor pillars extending in the stacking direction of the stacked body and penetrating through a center portion of the stacked body;
   a charge storage layer provided between one of the electrode films and one of the semiconductor pillars; and
   a plug buried in the interlayer dielectric film and connected to a portion of each of the electrode films constituting the step,
   a portion of each of the dielectric films in the center portion having a larger thickness than a portion of each of the dielectric films in the end portion.

2. The device according to claim 1, wherein the center portion of the stacked body has a larger thickness than the end portion of the stacked body.

3. The device according to claim 1, wherein the thickness of each of the dielectric films between the semiconductor pillars becomes thicker toward each of the semiconductor pillars.

4. The device according to claim 1, wherein a portion of each of the electrode films in the end portion has a larger thickness than a portion of each of the electrode films in the center portion.

5. The device according to claim 4, wherein the thickness of each of the dielectric films between the semiconductor pillars becomes thicker toward each of the semiconductor pillars.

6. The device according to claim 4, wherein the center portion of the stacked body has a larger thickness than the end portion of the stacked body.

7. The device according to claim 6, wherein the thickness of each of the dielectric films between the semiconductor pillars becomes thicker toward each of the semiconductor pillars.

8. The device according to claim 1, wherein the dielectric films are formed from an oxide of a material forming the electrode film.

9. The device according to claim 8, wherein the electrode films are formed from silicon, and the dielectric film is formed from silicon oxide.

10. The device according to claim 1, wherein the stacked body includes:
    a back gate electrode provided below the electrode films; and
    a connecting member provided in the back gate electrode and interconnecting between a lower end portion of one of the semiconductor pillars and a lower end portion of another of the semiconductor pillars.

11. The device according to claim 10, further comprising:
    a source line provided on the stacked body and connected to an upper end portion of the one of the semiconductor pillars connected to the connecting member; and
    a bit line provided on the stacked body and connected to an upper end portion of the another of the semiconductor pillars connected to the connecting member.

12. The device according to claim 11, wherein the bit line is provided above the source line, and an extending direction of the bit line is orthogonal to an extending direction of the source line.

* * * * *